(12) United States Patent
Sekiya

(10) Patent No.: US 10,763,172 B2
(45) Date of Patent: Sep. 1, 2020

(54) METHOD OF PROCESSING WAFER

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/233,833

(22) Filed: Dec. 27, 2018

(65) Prior Publication Data

US 2019/0206734 A1    Jul. 4, 2019

(30) Foreign Application Priority Data

Dec. 28, 2017   (JP) .................. 2017-254126

(51) Int. Cl.
| | | |
|---|---|---|
| *H01L 21/78* | (2006.01) | |
| *H01L 21/768* | (2006.01) | |
| *H01L 21/683* | (2006.01) | |
| *H01L 21/268* | (2006.01) | |

(52) U.S. Cl.
CPC ............ *H01L 21/78* (2013.01); *H01L 21/268* (2013.01); *H01L 21/6836* (2013.01)

(58) Field of Classification Search
CPC ... H01L 21/78; H01L 21/268; H01L 21/6836; H01L 2221/68377; H01L 2221/68386; H01L 2221/68327; H01L 2221/6834

USPC ........................................................ 438/463
See application file for complete search history.

(56) References Cited

U.S. PATENT DOCUMENTS

| | | | | |
|---|---|---|---|---|
| 10,312,099 B2* | 6/2019 | Sekiya | .................. | H01L 21/304 |
| 10,332,777 B2* | 6/2019 | Sekiya | .................... | H01L 21/56 |
| 10,403,490 B2* | 9/2019 | Sekiya | .................... | B24B 7/228 |
| 2006/0223285 A1* | 10/2006 | Shigematsu | ........ | H01L 21/6835 |
| | | | | 438/463 |
| 2018/0185964 A1* | 7/2018 | Yokoi | .................... | C09J 201/00 |

FOREIGN PATENT DOCUMENTS

JP          2006278684 A       10/2006

* cited by examiner

*Primary Examiner* — Caleen O Sullivan
(74) *Attorney, Agent, or Firm* — Greer Burns & Crain, Ltd.

(57) ABSTRACT

A method of processing a wafer having a face side where devices are formed in respective areas demarcated by a grid of projected dicing lines includes a groove forming step, a protective film sticking step, a protective-member-combined wafer forming step, a grinding step, a tape bonding step, a holding step, a peeling step, and a die-attach film dividing step.

7 Claims, 10 Drawing Sheets

METHOD OF PROCESSING WAFER

BACKGROUND OF THE INVENTION

Field of the Invention

The present invention relates to a method of processing a wafer.

Description of the Related Art

There has been known a DBG (Dicing Before Grinding) process as a process of manufacturing device chips by dividing a wafer. According to the DBG process, the face side of a wafer where devices are formed is half-cut, and thereafter the reverse side of the wafer is ground, dividing the wafer into device chips. The DBG process is advantageous in that it can restrain chipping of the reverse side of the wafer. In the DBG process, after the wafer has been divided into the device chips by dicing, an adhesive tape called die-attach film is applied to the reverse side of the wafer. The die-attach film is finally divided between the device chips, separating the device chips from each other. Japanese Patent No. 4478053 discloses a method of dividing the die-attach film by applying a laser beam to the die-attach film.

SUMMARY OF THE INVENTION

According to the DBG process, the layout of the device chips after the wafer is divided is maintained by the die-attach film. However, since the die-attach film is made of a soft material such as a resin, the layout of the device chips tends to be out of shape in a step subsequent to the application of the die-attach film. If the layout of the device chips varies, it is difficult to sever the die-attach film at a accurate position in a step of eventually separating the device chips. Japanese Patent No. 4478053 also reveals a process of detecting the positions of streets defined on the face side of the wafer and controlling the position of the laser beam applied to the die-attach film based on the detected positions of the streets, prior to the severance of the die-attach film. If this process is performed on a wafer where the layout of device chips has been largely become out of shape, then a processing time required to determine a position where the laser beam is to be applied is likely to be very long.

The present invention has been made in view of the above-mentioned problems. It is an object of the present invention to provide a method of processing a wafer in a manner to prevent the layout of device chips on the wafer from varying and to divide a die-attach film accurately.

In accordance with an aspect of the present invention, there is provided a method of processing a wafer having a face side where devices are formed in respective areas demarcated by a grid of projected dicing lines, including the steps of forming grooves in the wafer to a depth exceeding a finished thickness of the wafer along the projected dicing lines, covering the face side of the wafer with a protective film in intimate contact with the face side including the grooves, producing a protective-member-combined wafer that includes the wafer whose face side is covered with the protective member by covering the protective film with a protective member formed by curing a liquid resin that is curable by an external stimulus, holding the protective member of the protective-member-combined wafer on a chuck table, grinding a reverse side of the protective-member-combined wafer to thin the protective-member-combined wafer to the finished thickness, thereby exposing the grooves on the reverse side to divide the protective-member-combined wafer into a plurality of device chips, bonding a die-attach film held on a dicing tape to the reverse side of the protective-member-combined wafer that has been divided into the device chips, holding the dicing tape bonded to the protective-member-combined wafer where the device chips are kept in their layouts by the protective member, under suction on a chuck table of a laser processing apparatus, peeling off the protective film and the protective member from the face side of the protective-member-combined wafer while the device chips are being kept in their layouts by the protective-member-combined wafer held under suction on the chuck table, and applying a laser beam having a wavelength absorbable by the die-attach film to portions of the die-attach film that are exposed between the device chips, while the device chips are being kept in their layouts by the wafer being held under suction on the chuck table, thereby dividing the die-attach film along the projected dicing lines.

Preferably, the devices on the wafer have surface irregularities, and the step of covering the face side of the wafer with a protective film includes the step of covering the face side of the wafer with the protective film in intimate contact with the surface irregularities. Further preferably, the step of producing a protective-member-combined wafer includes the step of pressing the wafer through the protective film against the liquid resin applied to a flat sheet, and thereafter curing the liquid resin with the external stimulus to fix the protective member to the wafer.

In the method of processing a wafer according to the aspect of the present invention, after the protective film has been brought into intimate contact with the face side of the wafer including the grooves, the protective film is covered with the liquid resin that is curable by an external stimulus, and then, the liquid resin is cured. The wafer is now fixed to the protective member, preventing the layout of the device chips from varying in subsequent steps such as the step of grinding the reverse side of the wafer. In the method of processing a wafer according to the aspect of the present invention, furthermore, the protective member is peeled off after the die-attach film has been held under suction on the chuck table of the laser processing apparatus. Consequently, since the device chips are kept in position even after the protective member has been removed, the die-attach film can be divided at accurate positions.

The above and other objects, features and advantages of the present invention and the manner of realizing them will become more apparent, and the invention itself will best be understood from a study of the following description and appended claims with reference to the attached drawings showing a preferred embodiment of the present invention.

DETAILED DESCRIPTION OF THE PREFERRED EMBODIMENT

Figure 1:
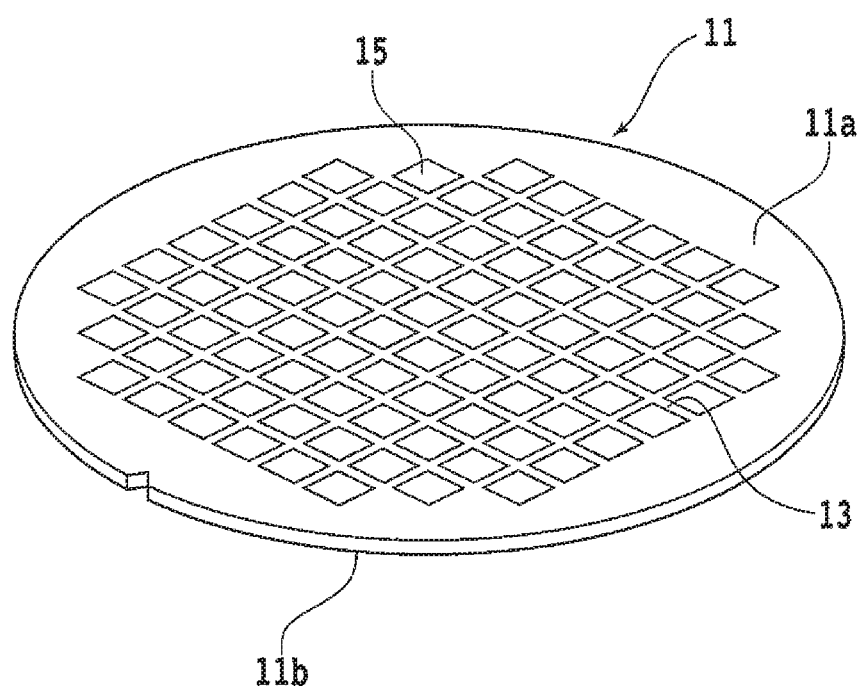
FIG. 1 is a perspective view of a wafer.

A method of processing a wafer according to an embodiment of the present invention will be described below with reference to the accompanying drawings. FIG. 1 is a perspective view of a wafer 11 to be processed by the method of processing a wafer according to the present embodiment. As illustrated in FIG. 1, the wafer 11 is of a disk shape having a face side 11a and a reverse side 11b. The wafer 11 may be made of a material such as silicon or the like, for example. The wafer 11 is demarcated into a plurality of areas by a grid of projected dicing lines or streets 13, with a plurality of devices 15 such as ICs (Integrated Circuits) or the like formed respectively in the areas. Though the wafer 11 is illustrated as being of a disk shape and made of silicon or the like in the present embodiment, the wafer 11 is not limited to any materials, shapes, structures, sizes, and so on. Instead, the wafer 11 may be made of materials including semiconductors, ceramics, resins, metals, and so on. Similarly, the devices 15 are not limited to any kinds, numbers, shapes, structures, sizes, layouts, and so on.

Figure 2A:
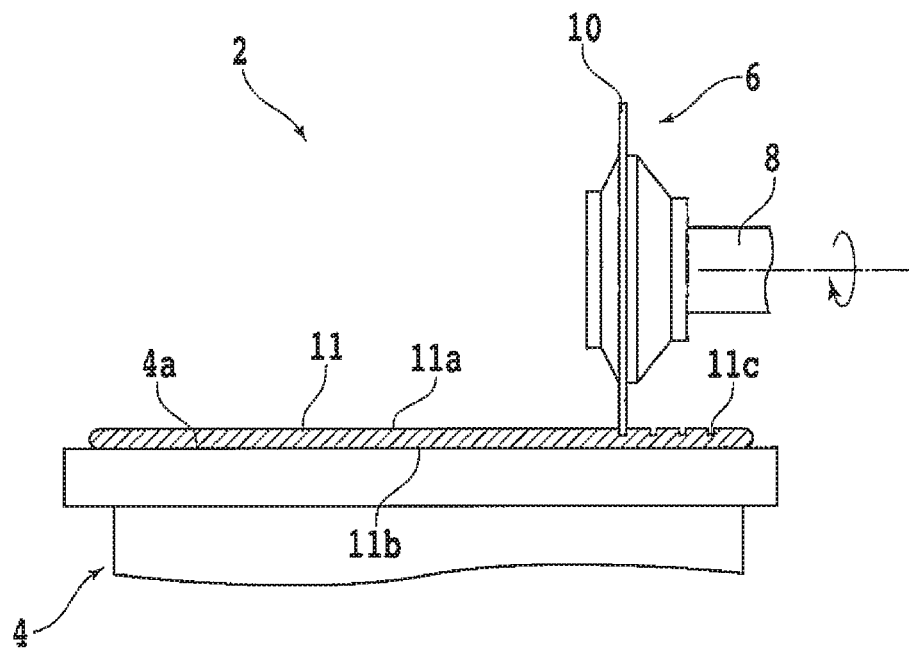
FIG. 2A is a cross-sectional view illustrating the manner in which grooves are formed in the face side of the wafer in a groove forming step.

Details of the method of processing a wafer according to the present embodiment will be described below. The method includes a plurality of steps to be described below. According to the present embodiment, a groove forming step is initially carried out to form grooves in the face side 11a of the wafer 11 to a depth exceeding a predetermined finished thickness of the wafer 11 along the projected dicing lines 13. FIG. 2A is a cross-sectional view illustrating the manner in which grooves are formed in the face side 11a of the wafer 11 in the groove forming step. As illustrated in FIG. 2A, the grooves are formed in the face side 11a of the wafer 11 using a cutting apparatus 2. The cutting apparatus 2 includes a chuck table or holding table 4 for holding the wafer 11 under suction thereon. The cutting apparatus 2 also includes a processing feed mechanism, not shown, disposed below the chuck table 4. The processing feed mechanism moves the chuck table 4 in processing feed directions or first horizontal directions. The chuck table 4 has an upper surface part of which functions as a holding surface 4a for holding the reverse side 11b of the wafer 11 under suction thereon. The holding surface 4a is connected to a suction source, not shown, through a suction channel, not shown, defined in the chuck table 4. The suction source generates a negative pressure that acts on the holding surface 4a to hold the wafer 11 under suction on the chuck table 4. The cutting apparatus 2 may alternatively employ a chuck table for mechanically or electrically holding the wafer 11 thereon, rather than the chuck table 4.

A cutting unit 6 for cutting the wafer 11 is disposed above the chuck table 4. The cutting unit 6 includes a spindle 8 having a central axis extending perpendicularly to the processing feed directions. An annular cutting blade 10 is mounted on an end of the spindle 8. The cutting blade 10 may be an electroformed grinding stone that is made of abrasive grains of diamond bound together by a layer of plated nickel, for example. The other end of the spindle 8 is coupled to a rotary actuator, not shown, such as a motor. The cutting blade 10 mounted on the spindle 8 can be rotated about its own axis by rotational forces that are transmitted from the rotary actuator through the spindle 8 when the rotary actuator is energized. The cutting unit 6 is supported by a lifting and lowering mechanism, not shown, and an indexing feed mechanism, not shown. The cutting unit 6 can be vertically moved or lifted and lowered in incising feed directions or vertical directions by the lifting and lowering mechanism. The cutting unit 6 can also be moved in indexing feed directions or second horizontal directions that are perpendicular to the cutting feed directions by the indexing feed mechanism.

In the groove forming step, the reverse side 11b of the wafer 11 is brought into contact with the holding surface 4a of the chuck table 4, and then a negative pressure from the suction source is caused to act on the holding surface 4a of the chuck table 4. The wafer 11 is now held under suction on the chuck table 4 with the face side 11a exposed upwardly. Then, the cutting blade 10 is rotated and lowered to incise the face side 11a of the wafer 11. More specifically, while the cutting blade 10 is incising the face side 11a of the wafer 11, the chuck table 4 is moved in a cutting feed direction, i.e., a direction parallel to the holding surface 4a and perpendicular to the central axis of the spindle 8. A straight groove 11c is now formed in the face side 11a of the wafer 11 along one of the projected dicing lines 13 (see FIG. 1). The cutting blade 10 incises the wafer 11 to a depth that is represented by a value smaller than the thickness of the wafer 11 and exceeding a finished thickness of the wafer 11. The finished thickness of the wafer 11 corresponds to the thickness of device chips into which the wafer 11 will finally be processed, i.e., divided.

Figure 2B:
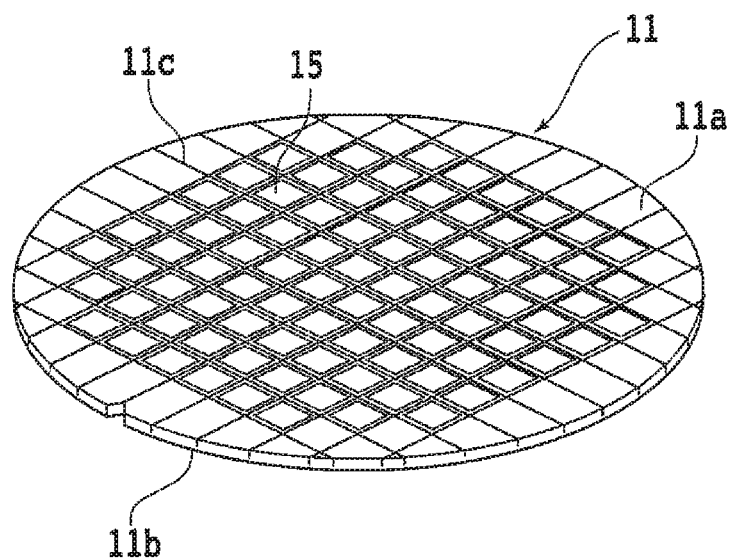
FIG. 2B is a perspective view of the wafer with the grooves formed therein in the groove forming step.

When grooves 11c have been formed in the face side 11a of the wafer 11 along all the projected dicing lines 13 illustrated in FIG. 1, the devices 15 are demarcated by the grooves 11c. FIG. 2B is a perspective view of the wafer 11 with the grooves 11c formed therein in the groove forming step. As illustrated in FIG. 2B, the grooves 11c are formed in a grid pattern in the face side 11a of the wafer 11. The grooves 11c thus formed in the face side 11a leaves the face side 11a uneven with surface irregularities. If the devices 15 have bumps thereon, then the bumps represent surface irregularities on the devices 15.

Next, a protective film sticking step is carried out to cover the face side 11a of the wafer 11 with a protective film and to bring the protective film into intimate contact with the face side 11a including the grooves 11c. Specifically, the protective film, which is free of an adhesive or glue, is placed over the face side 11a of the wafer 11, and brought into intimate contact with the face side 11a.

Figure 3A:
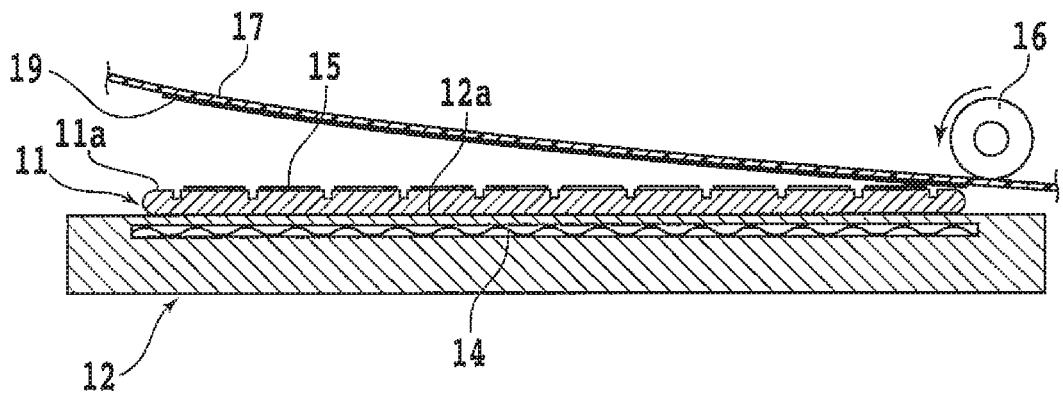
FIG. 3A is a cross-sectional view illustrating the manner in which the face side of the wafer is covered with a protective film.

FIG. 3A is a cross-sectional view illustrating the manner in which the face side 11a of the wafer 11 is covered with the protective film, denoted by 19. The protective film 19 may be a pliable film made of a material such as a resin or the like. The protective film 19 is free of an adhesive or glue. The protective film 19 is not limited to any materials or dimensions including a thickness, though it may be made of a resin such as polyolefin or the like and have a thickness ranging from 30 μm to 150 μm, for example. In the protective film sticking step, the reverse side 11b of the wafer 11 is supported on a support table 12. The support table 12 has an upper surface that is generally flat and functions as a support surface 12a for supporting the wafer 11 thereon. The support table 12 houses therein a heater 14 for heating the support surface 12a and hence the wafer 11 supported thereon.

Next, the protective film 19 that is held on a lower surface of a release liner 17 is positioned in facing relation to the face side 11a of the wafer 11. Then, a roller 16 is moved to roll on and press an upper surface of the release liner 17. At this time, the heater 14 may be energized to heat and soften the protective film 19. The protective film 19 is now pressed against the face side 11a, and brought into intimate contact with the face side 11a.

Figure 3B:
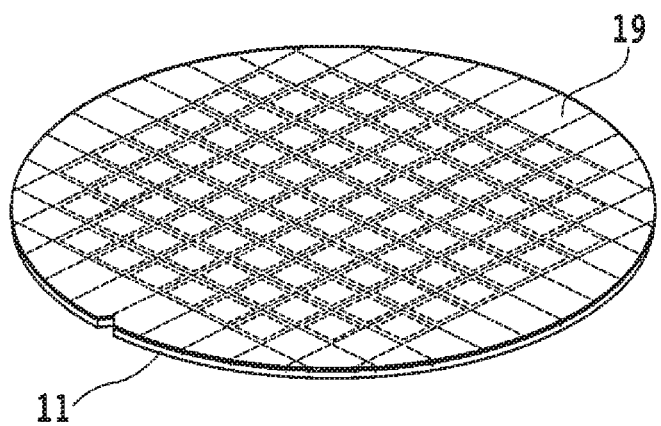
FIG. 3B is a perspective view of the wafer with the protective film held in intimate contact with the face side thereof.
Figure 3C:
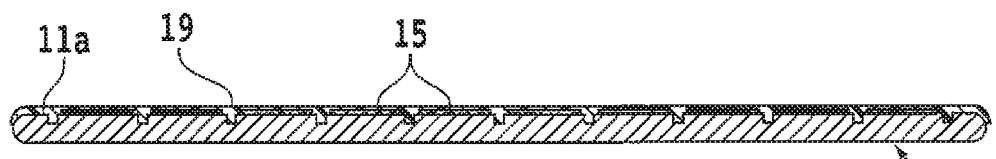
FIG. 3C is a cross-sectional view of the wafer with the protective film held in intimate contact with the face side thereof.
Figure 3D:
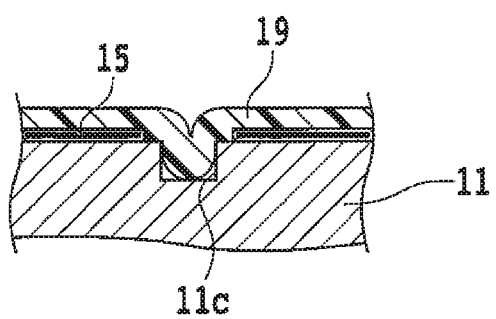
FIG. 3D is an enlarged fragmentary cross-sectional view of a portion of the wafer illustrated in FIG. 3C.

FIG. 3B is a perspective view of the wafer 11 with the protective film 19 held in intimate contact with the face side 11a thereof. FIG. 3C is a cross-sectional view of the wafer 11 with the protective film 19 held in intimate contact with the face side 11a thereof. FIG. 3D is an enlarged fragmentary cross-sectional view of a portion of the wafer 11 around the groove 11c illustrated in FIG. 3C. The protective film 19 is held in intimate contact with the face side 11a, closely following surface irregularities of the face side 11a. Specifically, as illustrated in FIG. 3D, the face side 11a of the wafer 11 include the grooves 11c as surface irregularities. The protective film 19 that is held in intimate contact with the face side 11a closely follows the grooves 11c. If the devices 15 have surface irregularities due to bumps thereon, then the protective film 19 is also held in intimate contact with the face side 11a in closely covering relation to such surface irregularities of the devices 15.

The protective film sticking step may be performed in a decompression chamber. Specifically, the wafer 11 and the protective film 19 are placed in the decompression chamber. When the protective film 19 is placed on the face side 11a of the wafer 11, the decompression chamber starts to be evacuated. The protective film 19 is now pressed against the face side 11a of the wafer 11 under reduced pressure. In addition, a gas or air that may be left between the protective film 19 and the face side 11a of the wafer 11 is removed.

After the decompression chamber has sufficiently been evacuated, air or atmosphere is introduced into the decompression chamber. The atmospheric pressure now acts on the protective film 19, which is held in intimate contact with the face side 11a in closely following the configuration of the face side 11a. When the atmospheric pressure acts on the protective film 19, the protective film 19 may be heated and softened by a heater into more intimate contact with the face side 11a of the wafer 11.

Figure 4A:
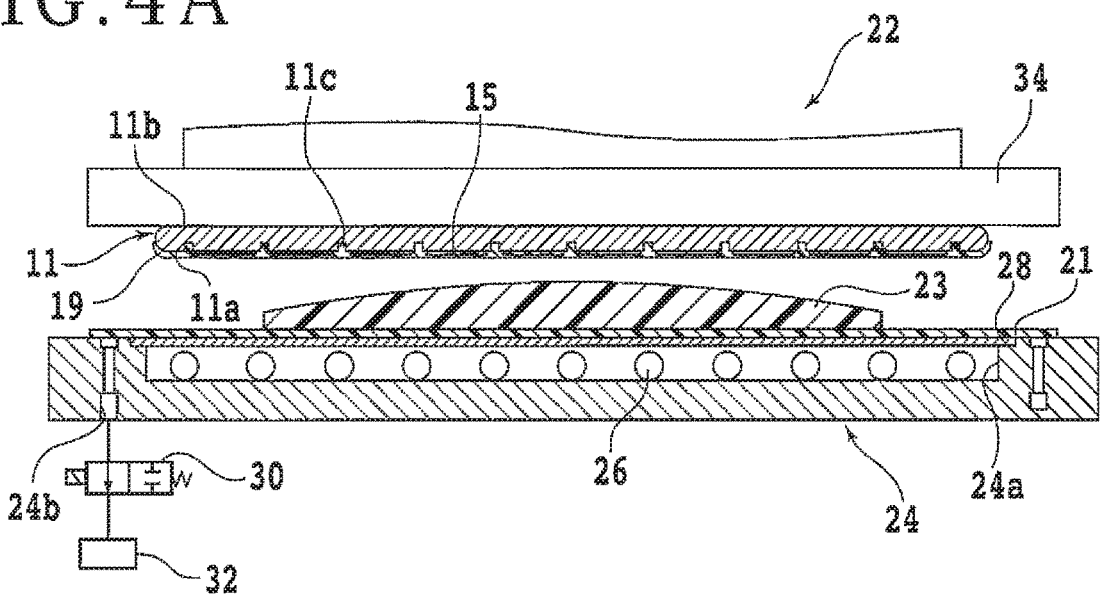
FIG. 4A is a cross-sectional view illustrating the manner in which the wafer is pressed against a liquid resin.
Figure 4B:
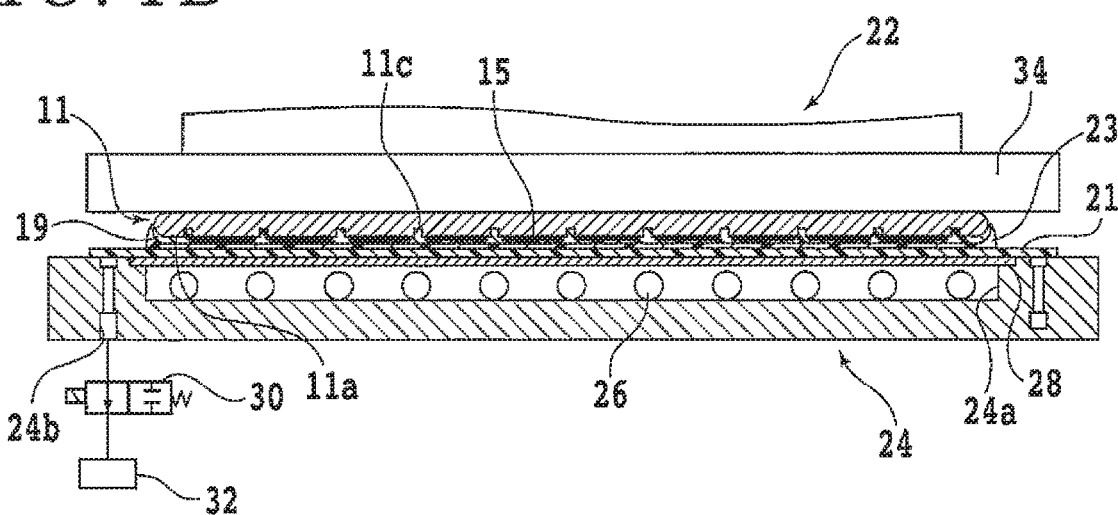
FIG. 4B is a cross-sectional view illustrating the manner in which a protective member is fixed to the wafer.
Figure 4C:
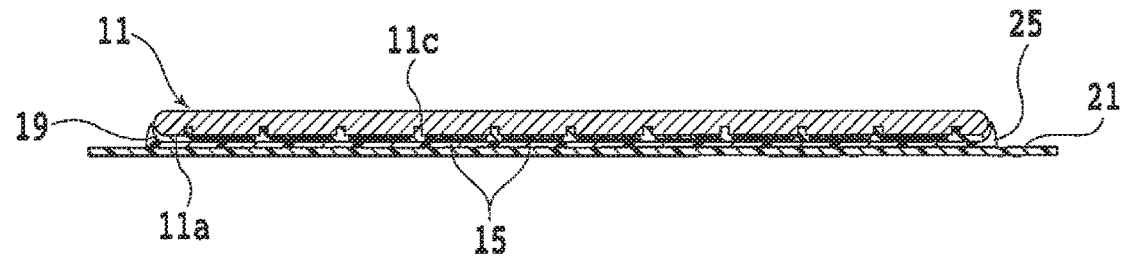
FIG. 4C is a cross-sectional view of the wafer that is combined with the protective member.

Next, a protective-member-combined wafer forming step is carried out to form a protective-member-combined wafer that includes the wafer 11 whose face side 11a is covered with the protective film 19 which is covered with a protective member formed by curing a liquid resin that is curable by an external stimulus. FIG. 4A is a cross-sectional view illustrating the manner in which the wafer 11 is pressed through the protective film 19 against a liquid resin 23 applied to a flat sheet. FIG. 4B is a cross-sectional view illustrating the manner in which a protective member 25 is fixed to the wafer 11 by curing the liquid resin 23. FIG. 4C is a cross-sectional view of the wafer that is combined with the protective member 25, i.e., a protective-member-combined wafer that has been completed. In FIGS. 4A and 4B, some parts are illustrated in block form.

The protective-member-combined wafer forming step according to the present embodiment is performed using a protective member fixing apparatus 22 illustrated in FIGS. 4A and 4B, for example. As illustrated in FIGS. 4A and 4B, the protective member fixing apparatus 22 includes a holding table 24 for holding thereon a substantially flat carrier sheet 21 made of a resin or the like. The holding table 24 has a circular cavity 24a defined in an upper surface thereof. The cavity 24a is larger in diameter than the wafer 11. The cavity 24a houses an ultraviolet source 26 therein. The cavity 24a has an upper end covered with a plate 28 that transmits therethrough part of an ultraviolet radiation emitted from the ultraviolet source 26. The carrier sheet 21 has a central portion supported on the plate 28. The holding table 24 has a suction channel 24b defined therein for attracting an outer peripheral area of the carrier sheet 21 under suction. The suction channel 24b has an upper end that is open at an upper surface of the holding table 24 around the cavity 24a. The suction channel 24b has a lower end connected through a valve 30 to a suction source 32. When a negative pressure from the suction source 32 acts through the suction channel 24b on the outer peripheral area of the carrier sheet 21, the carrier sheet 21 is held under suction on the holding table 24.

A wafer holding unit 34 for holding the wafer 11 under suction thereon is disposed above the holding table 24. The wafer holding unit 34 is supported by a moving mechanism, not shown. The wafer holding unit 34 is vertically movable by the moving mechanism while the wafer holding unit 34 is holding the wafer 11 under suction on its lower surface. The wafer holding unit 34 may be a vacuum-suction-type wafer holding unit for holding the wafer 11 under suction or negative pressure, or an electrostatic-attraction-type wafer holding unit for attracting and holding the wafer 11 under electrostatic forces.

In the protective-member-combined wafer forming step, as illustrated in FIG. 4A, the holding table 24 holds thereon the lower surface of the carrier sheet 21 whose upper surface has been coated with the liquid resin 23. The reverse side 11b of the wafer 11 is held under suction on the lower surface of the wafer holding unit 34. The protective film 19 that is held in intimate contact with the face side 11a of the wafer 11 is now disposed in facing relation to the liquid resin 23 on the carrier sheet 21. The liquid resin 23 is a liquid resin that is curable by an external stimulus. For example, the liquid resin 23 is a UV-curable liquid resin that is curable by an ultraviolet radiation emitted from the ultraviolet source 26, for example. As illustrated in FIG. 4A, the liquid resin 23 applied to the carrier sheet 21 should preferably have an upwardly convex surface. The liquid resin 23 with the upwardly convex surface makes it hard for a gas or air to remain between the protective film 19 and the liquid resin 23. In the present embodiment, the holding table 24 holds thereon the carrier sheet 21 whose upper surface has been coated with the liquid resin 23. However, the upper surface of the carrier sheet 21 may be coated with the liquid resin 23 after the carrier sheet 21 has been held on the holding table 24.

Then, the wafer holding unit 34 is lowered to press the face side 11a of the wafer 11 through the protective film 19 against the liquid resin 23. The liquid resin 23 is spread radially outwardly, covering the protective film 19. The applied amount of the liquid resin 23, the distance that the wafer holding unit 34 is lowered, and other parameters are adjusted in order to cover the face side 11a of the wafer 11 with the liquid resin 23. Thereafter, the ultraviolet source 26 emits an ultraviolet radiation to cure the liquid resin 23 into the protective member 25. As illustrated in FIG. 4C, the protective member 25 that covers the protective film 19 is thus fixed to the face side 11a of the wafer 11, whereupon a protective-member-combined wafer that includes the wafer 11 whose face side 11a is covered with the protective member 25 is formed. Though the face side 11a has surface irregularities including the devices 15, the grooves 11c, etc., the surface irregularities are sufficiently smoothed by forming the protective member 25 to an appropriate thickness.

Figure 5A:
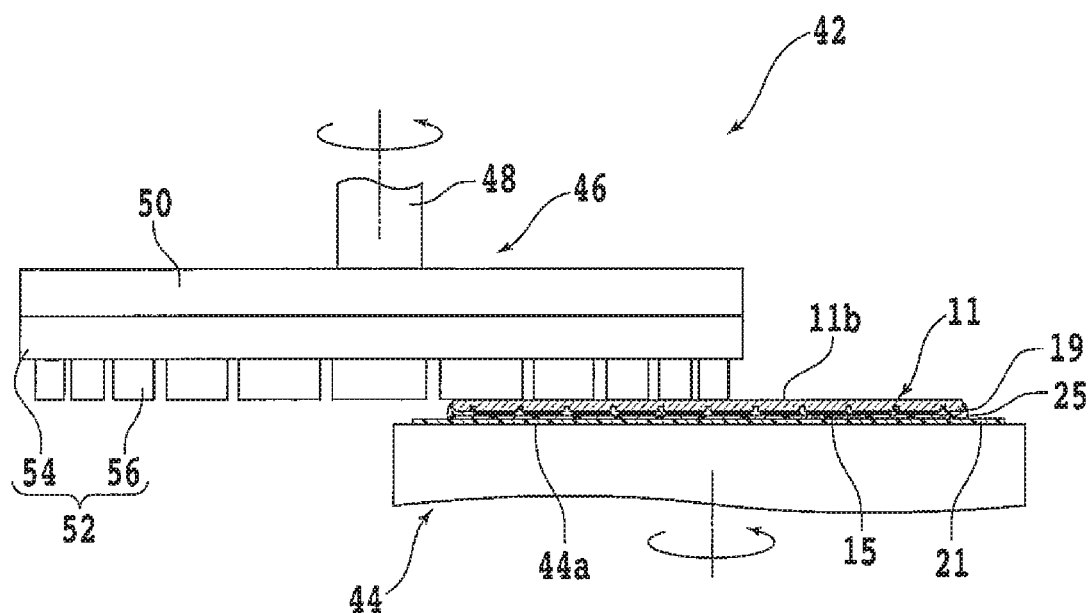
FIG. 5A is a cross-sectional view illustrating the manner in which the reverse side of the wafer is ground.
Figure 5B:
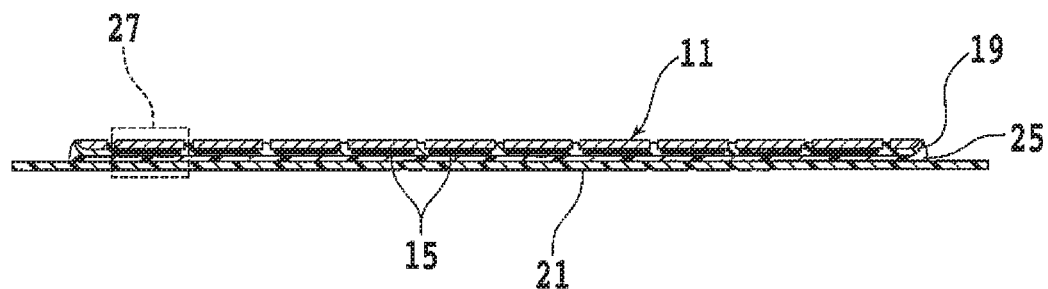
FIG. 5B is a cross-sectional view of the wafer that has been ground.

Next, a grinding step is carried out to divide the wafer 11 into a plurality of device chips by holding the protective member 25 on the wafer 11 on a chuck table and grinding the reverse side 11b of the wafer 11 to thin the wafer 11 to the finished thickness, thereby exposing the grooves 11c on the ground reverse side 11b. FIG. 5A is a cross-sectional view illustrating the manner in which the reverse side 11b of the wafer 11 is ground. FIG. 5B is a cross-sectional view of the wafer 11 that has been ground.

The grinding step is performed using a grinding apparatus 42 illustrated in FIG. 5A, for example. As illustrated in FIG. 5A, the grinding apparatus 42 includes a chuck table or holding table 44 for holding the wafer 11 under suction thereon. The chuck table 44 is coupled to a rotary actuator, not shown, such as a motor, and is rotatable about a rotational axis parallel to vertical directions. The chuck table 44 is movable in horizontal directions by a moving mechanism, not shown, that is disposed below the chuck table 44. The chuck table 44 has an upper surface part of which functions as a holding surface 44a for holding the carrier sheet 21 fixed to the wafer 11 through the protective member 25 under suction thereon. The holding surface 44a is connected to a suction source, not shown, through a suction channel, not shown, defined in the chuck table 44. The suction source generates a negative pressure that acts on the holding surface 44a to hold the wafer 11 under suction on the chuck table 44 through the carrier sheet 21 and the protective member 25. The grinding apparatus 42 may alternatively employ a chuck table for mechanically or electrically holding the wafer 11 thereon, rather than the chuck table 44.

A grinding unit 46 for grinding the wafer 11 is disposed above the chuck table 44. The grinding unit 46 includes a spindle housing, not shown, that is supported by a lifting and lowering mechanism, not shown. The spindle housing houses a spindle 48 that is rotatable about a vertical axis. A disk-shaped mount 50 is fixed to the lower end of the spindle 48. A grinding wheel 52 that is of substantially the same diameter as the mount 50 is mounted on the lower surface of the mount 50. The grinding wheel 52 includes a wheel base 54 made of a metal material such as stainless steel, aluminum, or the like and an array of grinding stones 56 disposed on the lower surface of the wheel base 54. The spindle 48 has an upper end (proximal end) coupled to a rotary actuator, not shown, such as a motor. When the rotary actuator is energized, it rotates the spindle 48 about the vertical axis, rotating the grinding wheel 52 about a rotational axis parallel to vertical directions. A nozzle, not shown, for supplying a grinding liquid such as pure water or the like to the wafer 11, etc. is disposed in or near the grinding unit 46.

In the grinding step, the wafer 11 is initially held under suction on the chuck table 44 of the grinding apparatus 42. Specifically, the carrier sheet 21 that is fixed to the wafer 11 through the protective member 25 is brought into contact with the holding surface 44a of the chuck table 44. Then, a negative pressure from the suction source is caused to act on the holding surface 44a, holding the wafer 11 on the chuck table 44 with the reverse side 11b exposed upwardly. Then, the chuck table 44 is horizontally moved to a position below the grinding unit 46. While the chuck table 44 and the grinding wheel 52 are being rotated respectively about their rotational axes, and also while the grinding liquid is being supplied to the reverse side 11b of the wafer 11, etc., the spindle housing, the spindle 48, and the grinding wheel 52 are lowered by the lifting and lowering mechanism. The speed at which the spindle housing is lowered, or the distance that the spindle housing is lowered, is adjusted in order to press the lower surfaces of the grinding stones 56 against the reverse side 11b of the wafer 11 under appropriate forces. The grinding stones 56 are pressed against, and hence grind the reverse side 11b of the wafer 11 to thin the wafer 11. When the wafer 11 is thinned to the predetermined finished thickness by the grinding stones 56, exposing the grooves 11c on the reverse side 11b, the wafer 11 is separated into a plurality of device chips 27, as illustrated in FIG. 5B. When the wafer 11 is thinned to the finished thickness, the grinding step comes to an end.

In the present embodiment, the reverse side lib of the wafer 11 is ground by the single grinding unit 46. However, the wafer 11 may be ground using two or more grinding units. If two grinding units are employed, then they have respective arrays of grinding stones made of abrasive grains. The abrasive grains of one of the arrays of grinding stones are larger in diameter, whereas the abrasive grains of the other of the arrays of grinding stones are smaller in diameter. The wafer 11 may be ground in a rough grinding mode by the array of grinding stones whose abrasive grains are larger in diameter, and then ground in a finishing grinding mode by the array of grinding stones whose abrasive grains are smaller in diameter. When the wafer 11 is thus ground using the arrays of grinding stones in succession, the reverse side 11b of the wafer 11 can be highly planarized in a relatively short period of time. In the grinding step according to the present embodiment, the wafer 11 is fixed to the protective member 25 that is formed by curing the liquid resin 23. Therefore, any changes in the layout of the device chips 27 at the time of grinding the wafer 11 are minimized.

Figure 6A:
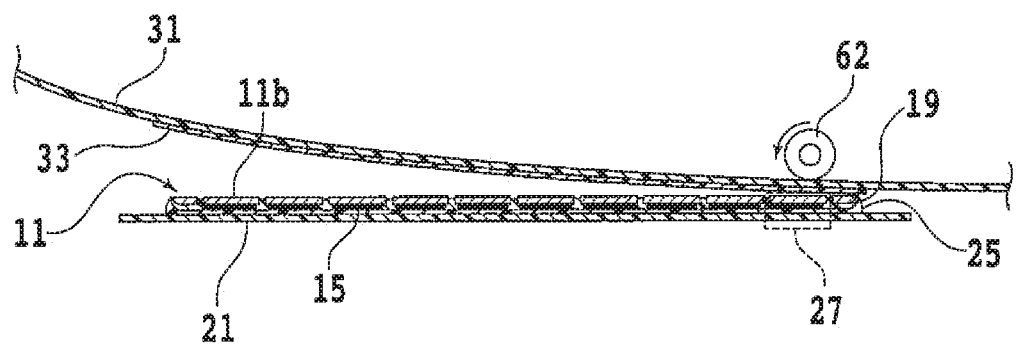
FIG. 6A is a cross-sectional view illustrating the manner in which a die-attach film is bonded to the reverse side of the wafer.

Next, a tape bonding step is carried out to apply a die-attach film held on a dicing tape to the reverse side 11b of the wafer 11 that has been separated into the device chips 27. FIG. 6A is a cross-sectional view illustrating the manner in which a die-attach film or DAF 33 is bonded to the reverse side 11b of the wafer 11. The die-attach film 33, which functions as an adhesive tape, may be made of a soft material such as a resin. The die-attach film 33 is not particularly limited to any dimensions including a thickness.

Figure 6B:
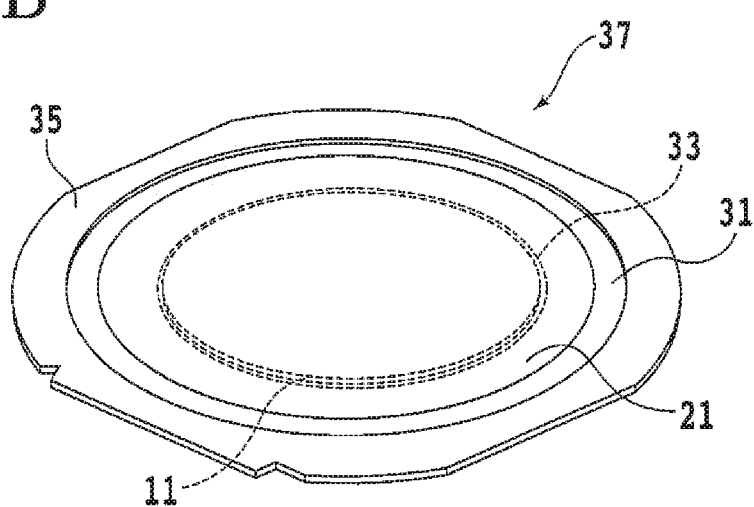
FIG. 6B is a perspective view of a frame unit that includes the wafer with the die-attach film bonded to the reverse side thereof.
Figure 6C:
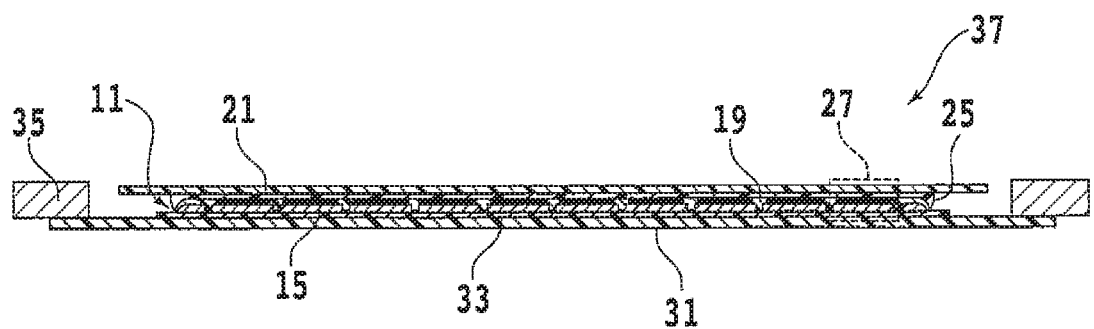
FIG. 6C is a cross-sectional view of the frame unit that includes the wafer with the die-attach film bonded to the reverse side thereof.

In the tape bonding step, the die-attach film 33 that is held on a lower surface of a dicing tape 31 is positioned in facing relation to the reverse side 11b of the wafer 11 that has been separated into the device chips 27. Then, a roller 62 is moved to roll on and press an upper surface of the dicing tape 31. The die-attach film 33 is now bonded to the reverse side 11b of the wafer 11 that has been separated into the device chips 27. FIG. 6B is a perspective view of a frame unit 37 that includes the wafer 11 with the die-attach film 33 bonded to the reverse side 11b of the wafer 11. FIG. 6C is a cross-sectional view of the frame unit 37. As illustrated in FIG. 6B, the reverse side 11b of the wafer 11 is bonded to the die-attach film 33, and the dicing tape 31 has its outer peripheral portion bonded to an annular frame 35, making up the frame unit 37. The wafer 11 is supported on the annular frame 35 by the dicing tape 31 and the die-attach film 33. As illustrated in FIG. 6C, the protective film 19, the protective member 25, and the carrier sheet 21 are successively placed on the face side 11a of the wafer 11 that has been separated into the device chips 27. The device chips 27 are kept in their layout by the protective member 25 and the die-attach film 33.

Then, a holding step is carried out to hold the dicing tape 31 on the wafer 11 where the device chips 27 are kept in their layout by the protective member 25, under suction on a chuck table of a laser processing apparatus. The laser processing apparatus applies a laser beam to the die-attach film 33 to divide the die-attach film 33 along the projected dicing lines 13, as described later.

Figure 7:
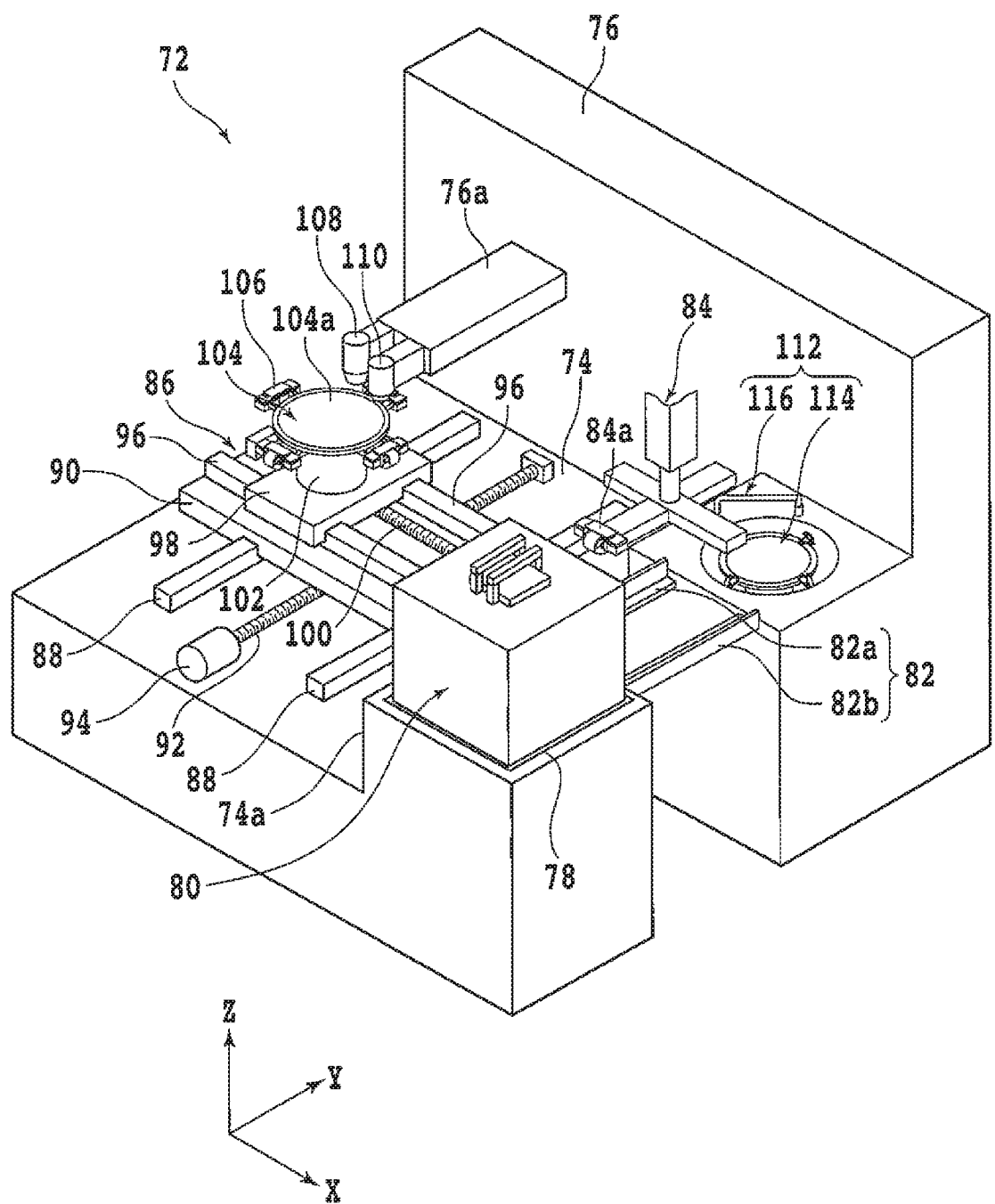
FIG. 7 is a perspective view of a laser processing apparatus.

A configuration example of the laser processing apparatus will be described below. FIG. 7 is a perspective view of a configuration example of the laser processing apparatus. As illustrated in FIG. 7, the laser processing apparatus, denoted by 72, includes a base 74 supporting various components thereon. A support structure 76 that extends along a Z-axis, i.e., vertical directions or height directions, is disposed on an end of the base 74. The base 74 includes a protrusive portion 74a that projects upwardly from a corner of the base 74 that is spaced from the support structure 76. The protrusive portion 74a has a space defined therein that houses a vertically movable cassette elevator 78 therein. A cassette 80 that can accommodate a plurality of wafers 11 therein is placed on an upper surface of the cassette elevator 78. A temporary placing mechanism 82 for temporarily placing a wafer 11 thereon is disposed in a position close to the protrusive portion 74a. The temporary placing mechanism 82 includes a pair of guide rails 82a and 82b that can be moved toward and away from each other while being kept parallel along a Y-axis, i.e., indexing feed directions, perpendicular to the Z-axis. The guide rails 82a and 82b have respective support surfaces for supporting a wafer 11, i.e., a frame unit 37, thereon and respective side surfaces perpendicular to the support surfaces. The guide rails 82a and 82b sandwich a wafer 11, i.e., a frame unit 37, withdrawn from the cassette 80 by a feed mechanism 84, therebetween along an X-axis, i.e., processing feed directions, perpendicular to the Z-axis and the Y-axis, in alignment with a predetermined position. The feed mechanism 84 includes a gripper 84a for gripping an annular frame on a side thereof near the protrusive portion 74a.

A moving mechanism 86 is disposed centrally on the base 74. The moving mechanism 86 includes a pair of Y-axis guide rails 88 disposed on an upper surface of the base 74 and lying parallel to the Y-axis. A Y-axis movable table 90 is slidably mounted on the Y-axis guide rails 88.

A nut, not shown, is mounted on a reverse side or lower surface of the Y-axis movable table 90, and threaded over a Y-axis ball screw 92 extending parallel to the Y-axis guide rails 88. The Y-axis ball screw 92 has an end coupled to a Y-axis stepping motor 94. When the Y-axis stepping motor 94 is energized, it rotates the Y-axis ball screw 92 about its own axis, moving the Y-axis movable table 90 along the Y-axis on the Y-axis guide rails 88. The Y-axis movable table 90 supports on its front side (upper surface) a pair of X-axis guide rails 96 lying parallel to the X-axis. An X-axis movable table 98 is slidably mounted on the X-axis guide rails 96. A nut, not shown, is mounted on a reverse side or lower surface of the X-axis movable table 98, and threaded over an X-axis ball screw 100 extending parallel to the X-axis guide rails 96. The X-axis ball screw 100 has an end coupled to an X-axis stepping motor, not shown. When the X-axis stepping motor is energized, it rotates the X-axis ball screw 100 about its own axis, moving the X-axis movable table 98 along the X-axis on the X-axis guide rails 96.

The X-axis movable table 98 supports a table base 102 thereon. A chuck table or holding table 104 for holding a wafer 11 under suction thereon is disposed on an upper portion of the table base 102. Four angularly spaced clamps 106 for clamping the annular frame 35 that supports the wafer 11 are disposed around the chuck table 104.

The chuck table 104 is coupled to a rotary actuator, not shown, such as a motor, disposed in the table base 102. The chuck table 104 is rotated about a rotational axis parallel to the Z-axis or vertical direction, or height direction, when the rotary actuator is energized. When the moving mechanism 86 moves the X-axis movable table 98 along the X-axis, the chuck table 104 is processing-fed along the X-axis. When the moving mechanism 86 moves the Y-axis movable table 90 along the Y-axis, the chuck table 104 is indexing-fed along the Y-axis. The chuck table 104 has an upper surface functioning as a holding surface 104a for holding the wafer 11 thereon. The holding surface 104a lies parallel to the X-axis and the Y-axis, and is connected to a suction source, not shown, through a suction channel, not shown, defined in the chuck table 104 and the table base 102.

A support arm 76a projects along the Y-axis from the support structure 76 toward a central area of the base 74. A beam condenser or processing head 108 for emitting a laser beam downwardly is disposed on a distal end of the support arm 76a above the chuck table 104. A camera or image capturing unit 110 for capturing an image of the wafer 11 on the holding surface 104a of the chuck table 104 is also disposed adjacent to the beam condenser 108 on the distal end of the support arm 76a. The support arm 76a houses therein a laser oscillator, not shown, for oscillating a pulsed laser beam having a wavelength that is absorbable by the die-attach film 33. The beam condenser 108 focuses the pulsed laser beam oscillated by the laser oscillator onto the die-attach film 33 held on the chuck table 104. While the pulsed laser beam is being focused and applied to the die-attach film 33 by the beam condenser 108, the chuck table 104 is processing-fed along the X-axis to divide the die-attach film 33 along the X-axis.

The wafer 11 thus processed is fed from the chuck table 104 to a cleaning unit 112, for example, by the feed mechanism 84. The cleaning unit 112 includes a spinner table 114 for holding the wafer 11 under suction thereon in a tubular cleaning space. The spinner table 114 has a lower portion coupled to a rotary source, not shown, that rotates the spinner table 114 at a predetermined speed about a rotational axis parallel to the Z-axis. The cleaning unit 112 also includes an ejection nozzle 116 disposed above the spinner table 114 for ejecting a cleaning fluid, typically a mixture of two fluids such as water and air, toward the wafer 11 on the spinner table 114. The wafer 11 on the spinner table 114 is cleaned by the cleaning fluid ejected from the ejection nozzle 116 while the spinner table 114 is being rotated. The wafer 11 that has been cleaned by the cleaning unit 112 is taken from the cleaning unit 112 onto the temporary placing mechanism 82 and then delivered back into the cassette 80 by the feed mechanism 84.

The components including the feed mechanism 84, the moving mechanism 86, the chuck table 104, the beam condenser 108, the camera 110, the cleaning unit 112, and so on are connected to a control unit, not shown. The control unit controls the components in a sequence of steps to process each of the wafer 11.

Figure 8:
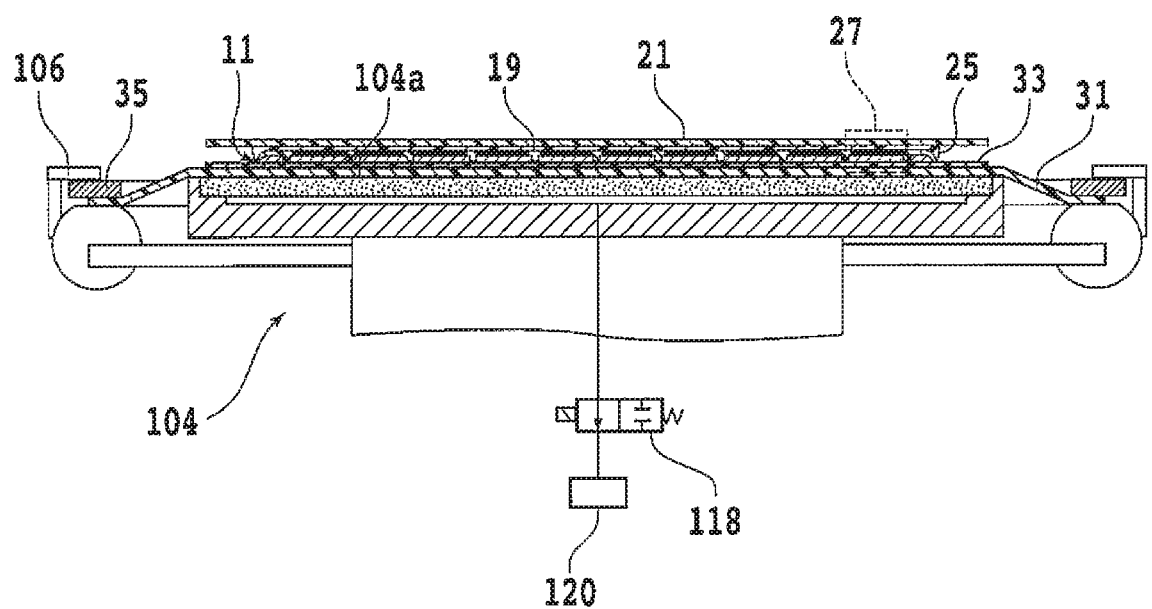
FIG. 8 is a cross-sectional view illustrating the manner in which the wafer is held on the holding surface of a chuck table of the laser processing apparatus.

In the holding step, the dicing tape 31 on the wafer 11 is held on the chuck table 104. FIG. 8 is a cross-sectional view illustrating the manner in which the wafer 11 is held on the holding surface 104a of the chuck table 104 of the laser processing apparatus 72. When the holding step is started, the dicing tape 31 is brought into contact with the holding surface 104a of the chuck table 104. A negative pressure from the suction source, denoted by 120, is applied via a valve 118 to the holding surface 104a, holding the wafer 11 under suction on the chuck table 104. The clamps 106 are actuated to secure the annular frame 35 on which the outer peripheral portion of the dicing tape 31 is mounted. The wafer 11 is thus held on the chuck table 104 through the dicing tape 31 and the die-attach film 33.

Figure 9A:
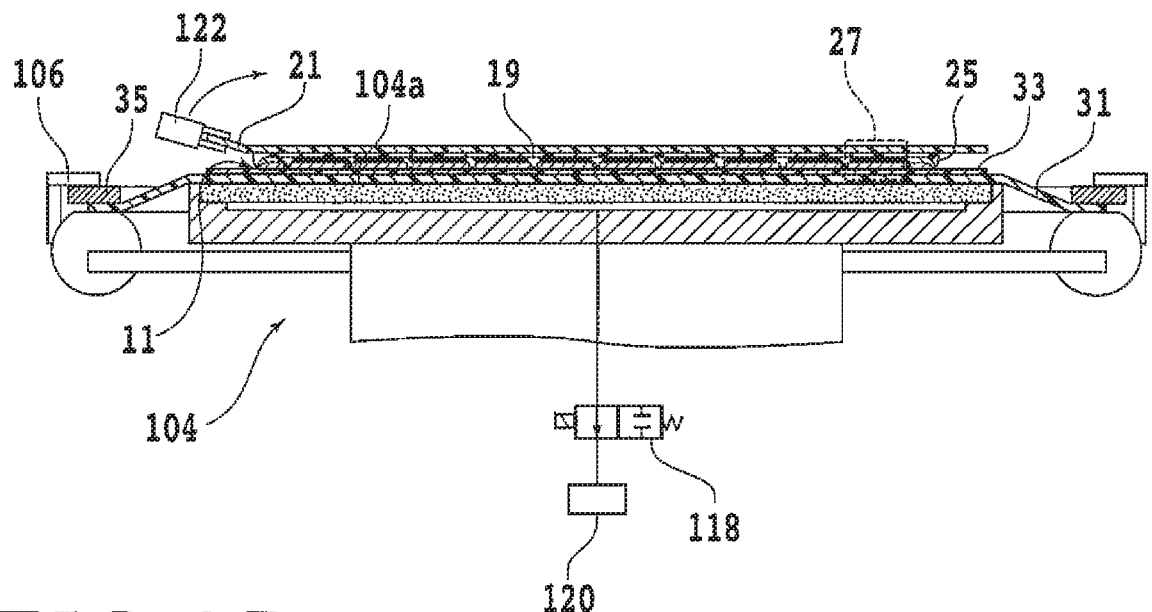
FIGS. 9A and 9B are cross-sectional views illustrating the manner in which the protective film, a carrier sheet, and the protective member are peeled off from the wafer.
Figure 9B:
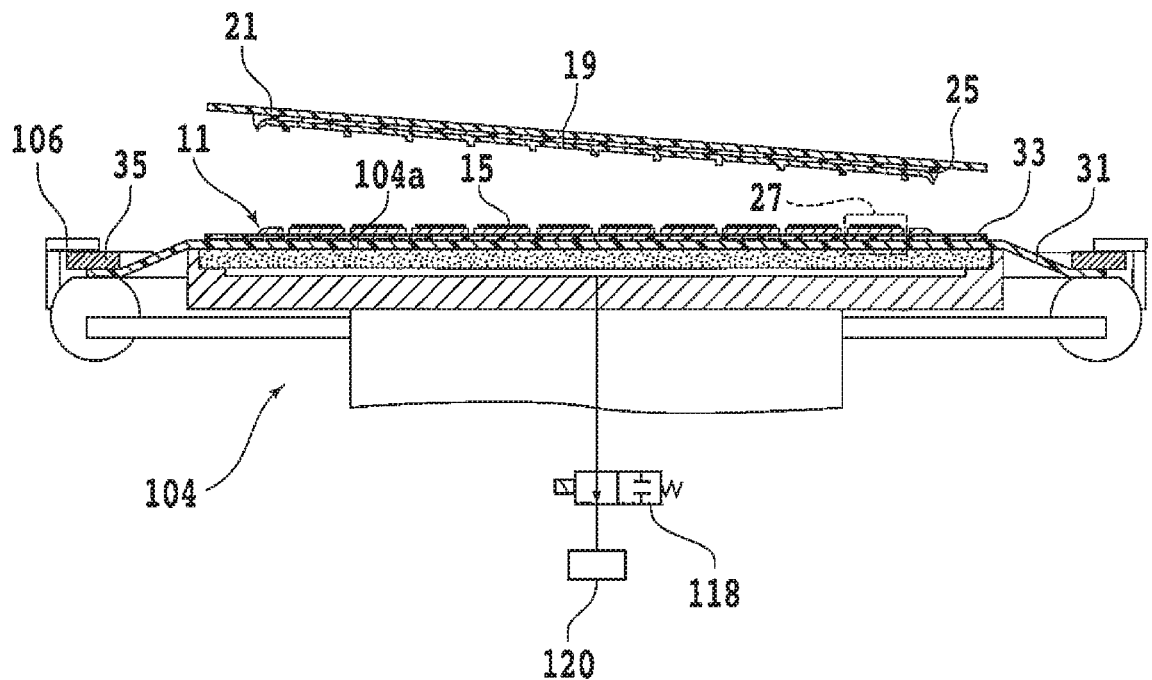

Then, while the device chips 27 are being kept in their layout by the protective-member-combined wafer held under suction on the chuck table 104, a peeling step is carried out to peel off the protective film 19 and the protective member 25 from the face side of the protective-member-combined wafer. FIGS. 9A and 9B are cross-sectional views illustrating the manner in which the protective film 19, the carrier sheet 21, and the protective member 25 are peeled off from the wafer 11. The peeling step is performed using a peeling unit 122 illustrated in FIG. 9A.

In the peeling step, as illustrated in FIG. 9A, the peeling unit 122 grips an end of the carrier sheet 21 while the wafer 11 is being held under suction on the chuck table 104. Then, the chuck table 104 and the peeling unit 122 are moved relatively to each other to peel off the protective film 19 from the wafer 11. As illustrated in FIG. 9B, the protective film 19, the carrier sheet 21, and the protective member 25 are now peeled off and removed all together from the wafer 11. The protective film 19, the carrier sheet 21, and the protective member 25 that have been peeled off and removed are discarded. Since the protective film 19 has been stuck, but not bonded, to the wafer 11, the protective film 19 and the protective member 25 can easily be peeled off and removed from the wafer 11 without involving a large-scale process such as immersion of the wafer 11 in a solution or heating at high temperatures. As no adhesive remains on the wafer 11, no process is required to remove any adhesive from the wafer 11. In the peeling step, the wafer 11 is held under suction on the chuck table 104. Therefore, the device chips 27 are kept accurately in their layout even after the protective film 19 and the protective member 25 have been peeled off and removed from the wafer 11.

Then, while device chips 27 are being kept in their layout by the wafer 11 held under suction on the chuck table 104, a die-attach film dividing step is carried out to apply the pulsed laser beam whose wavelength is absorbable by the die-attach film 33 to the portions of the die-attach film 33 that are exposed between the device chips 27, thereby dividing the die-attach film 33 along the projected dicing lines 13.

Figure 10:
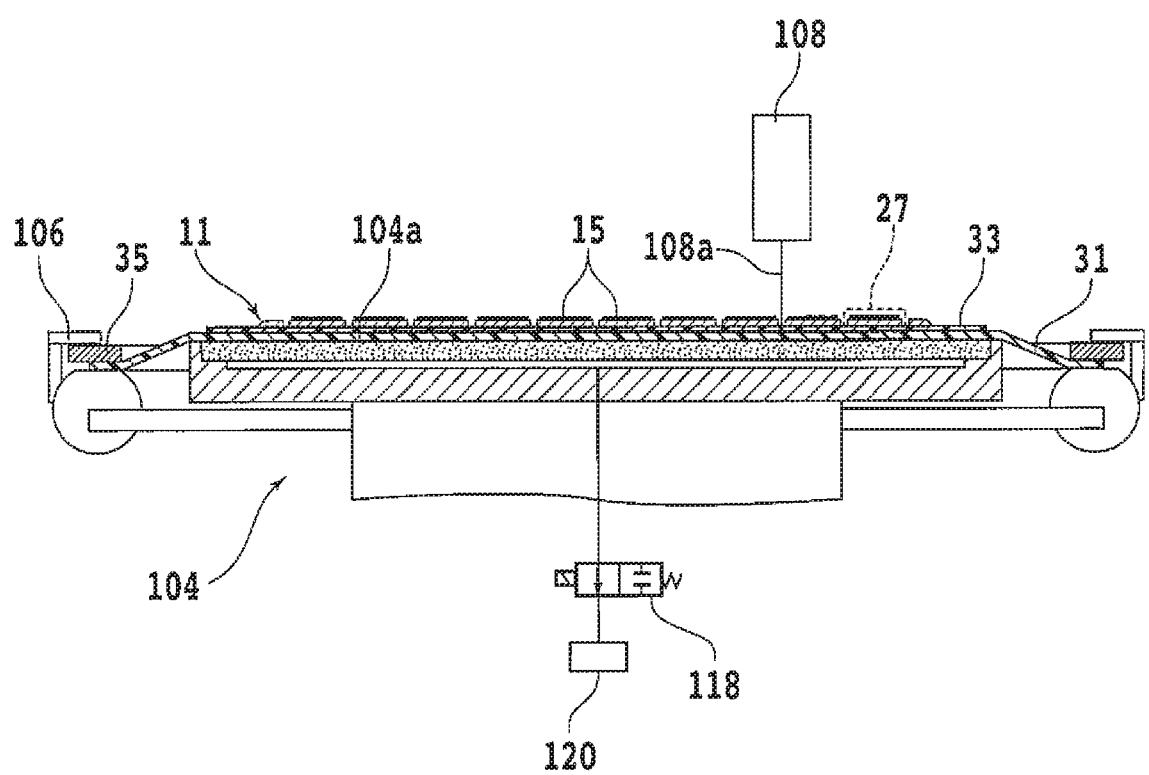
FIG. 10 is a cross-sectional view illustrating the manner in which the die-attach film is divided.

FIG. 10 is a cross-sectional view illustrating the manner in which the die-attach film 33 is divided along the projected dicing lines 13 (see FIG. 1). As illustrated in FIG. 10, the die-attach film dividing step is performed using the laser processing apparatus 72 illustrated in FIG. 7. The wafer 11 is held under suction on the chuck table 104. The beam condenser 108, which applies the pulsed laser beam, denoted by 108a, whose wavelength that is absorbable by the die-attach film 33, to the wafer 11 on the chuck table 104, is disposed above the chuck table 104. The laser beam 108a is applied from the beam condenser 108 to the die-attach film 33 to divide the die-attach film 33 along the projected dicing lines 13. Specifically, as illustrated in FIG. 10, the pulsed laser beam 108a is applied to the portions of the die-attach film 33 that are exposed between the device chips 27, while the chuck table 104 is moved in directions parallel to the holding surface 104a so as to allow the pulsed laser beam 108a to be applied along the projected dicing lines 13. The die-attach film 33 is now divided along the projected dicing lines 13, separating the device chips 27 each with a corresponding piece of the die-attach film 33.

According to the present embodiment, as described above, after the die-attach film 33 has been held under suction on the chuck table 104, the protective film 19 and the protective member 25 are peeled off from the wafer 11. Therefore, even after the protective member 25 has been removed, the device chips 27 separated from the wafer 11 where the devices 15 had been formed in the grid pattern are kept in their layout. Consequently, for dividing the die-attach film 33, the pulsed laser beam 108a may only be applied between the device chips 27 kept in the grid pattern. Time periods required to detect the position where the laser beam is applied and the control unit can be omitted.

The structural details and methods according to the above embodiment can be appropriately modified or changed without departing from the scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claims is:

1. A method of processing a wafer having a face side where devices are formed in respective areas demarcated by a grid of projected dicing lines, comprising the steps of:
   forming grooves in the wafer to a depth exceeding a finished thickness of the wafer along the projected dicing lines;
   covering the face side of the wafer with a protective film in intimate contact with the face side including the grooves;
   producing a protective-member-combined wafer that includes the wafer whose face side is covered with the protective film and a protective member formed by pressing the protective film onto a flat sheet and curing a liquid resin applied to the flat sheet, wherein the liquid resin is curable by an external stimulus, such that the liquid resin forms the protective member;
   holding the protective member of the protective-member-combined wafer on a chuck table, grinding a reverse side of the protective-member-combined wafer to thin the protective-member-combined wafer to the finished thickness, thereby exposing the grooves on the reverse side to divide the protective-member-combined wafer into a plurality of device chips;

bonding a die-attach film held on a dicing tape to the reverse side of the protective-member-combined wafer that has been divided into the device chips;

holding the dicing tape bonded to the protective-member-combined wafer where the device chips are kept in their layouts by the protective member, under suction on a chuck table of a laser processing apparatus;

peeling off the protective film and the protective member from the face side of the protective-member-combined wafer while the device chips are being kept in their layouts by the protective-member-combined wafer held under suction on the chuck table; and applying a laser beam having a wavelength absorbable by the die-attach film to portions of the die-attach film that are exposed between the device chips, while the device chips are being kept in their layouts by the wafer being held under suction on the chuck table, thereby dividing the die-attach film along the projected dicing lines.

2. The method according to claim 1, wherein the devices on the wafer have surface irregularities, and the step of covering the face side of the wafer with a protective film includes the step of covering the face side of the wafer with the protective film in intimate contact with the surface irregularities.

3. The method according to claim 1, wherein curing the liquid resin with the external stimulus comprises transmitting ultraviolet radiation emitted from an ultraviolet source disposed within the cavity of a holding table.

4. The method according to claim 1, wherein the step of producing a protective-member-combined wafer includes inverting the wafer prior to pressing the protective film onto the flat sheet.

5. The method according to claim 1, wherein the step of bonding a die attach film further comprises bonding the die attach film to an annular frame.

6. The method according to claim 1, further comprising inverting the protective-member-combined wafer prior to the step of peeling off the protective film and protective member.

7. The method according to claim 1, wherein the protective film is free of an adhesive or glue.

* * * * *

UNITED STATES PATENT AND TRADEMARK OFFICE
CERTIFICATE OF CORRECTION

PATENT NO. : 10,763,172 B2  
APPLICATION NO. : 16/233833  
DATED : September 1, 2020  
INVENTOR(S) : Kazuma Sekiya Page 1 of 1

It is certified that error appears in the above-identified patent and that said Letters Patent is hereby corrected as shown below:

In the Claims

In Column 14, Line 7, in Claim 3, delete "the cavity" and insert --a cavity-- therefor.

Signed and Sealed this  
Tenth Day of November, 2020

Andrei Iancu  
*Director of the United States Patent and Trademark Office*